United States Patent [19]

Kohsaka

[11] Patent Number: 5,424,668
[45] Date of Patent: Jun. 13, 1995

[54] PULSE DUTY RATIO DESCRIMINATION CIRCUIT

[75] Inventor: Yoshiaki Kohsaka, Saitama, Japan

[73] Assignee: Kabushiki Kaisha Toshiba, Kawasaki, Japan

[21] Appl. No.: 149,822

[22] Filed: Nov. 10, 1993

[30] Foreign Application Priority Data

Nov. 10, 1992 [JP] Japan .................. 4-299626

[51] Int. Cl.[6] ........................ H03K 5/26; H03K 5/19
[52] U.S. Cl. ........................ 327/175; 327/37; 327/35; 360/46; 360/51
[58] Field of Search ............... 307/234, 265; 360/51, 360/61, 46; 377/39; 340/146.2; 327/175, 37, 35

[56] References Cited

U.S. PATENT DOCUMENTS

| | | | |
|---|---|---|---|
| 4,355,283 | 10/1982 | Ott | 307/265 |
| 4,562,549 | 12/1985 | Tanaka et al. | 307/234 |
| 4,639,793 | 1/1987 | Goldmann | 307/234 |
| 4,691,330 | 9/1987 | Takahashi et al. | 377/39 |

OTHER PUBLICATIONS

Patent Abstracts of Japan, vol. 14, No. 268 (E-939)(4211) 11 Jun. 1990 & JP-A-02 084 812 (NEC Corp) 26 Mar. 1990 *abstract*.
Patent Abstracts of Japan, vol. 016, No. 237 (P-1362) 29 May 1992 & JP-A-04 050 775 (Toshiba Corp) 19 Feb. 1992 *abstract*.
Patent Abstracts of Japan, vol. 012, No. 457 (E-688) 30 Nov. 1988 & JP-A-63 182 911 (Hitachi Ltd) 28 Jul. 1988 *absract*.
Patent Abstracts of Japan, vol. 012, No. 361 (P-763) 28 Sep. 1988 & JP-A-63 113 366 (Rohm Co Ltd) 18 May 1988 *abstract*.

*Primary Examiner*—Timothy P. Callahan
*Assistant Examiner*—Terry L. Englund
*Attorney, Agent, or Firm*—Cushman Darby & Cushman

[57] ABSTRACT

In a pulse duty ratio discrimination circuit for discriminating duty ratios of input signals by comparing a count value with a threshold value through means of counting, with a counter using clocks, a time period starting with a reference level changing point occurring every predetermined period in the input signal and ending with a level returning point, the present invention is characterized by a pulse duty ratio discrimination circuit that includes not only period determination means for determining the periods of the input signals by resetting the count value of the counter at the period of the input signal and by comparing actual count values for a plural number of count patterns of the counter established in advance, but also clock selection means for selecting the frequency of the clock based on a determination result of the period determination means.

6 Claims, 5 Drawing Sheets

FIG. 4

| STATE | PATTERN 0 (12.5%) | PATTERN 1 (50%) | Q$_0$ | Q$_1$ | U/D | CHANGE IN SELECTED REFERENCE CLOCK |
|---|---|---|---|---|---|---|
| 1 | 1 | 1 | 0 | 0 | U | f$_1$ → f$_2$ |
| 2 | 1 | 1 | 1 | 0 | U | f$_2$ → f$_3$ |
| 3 | 1 | 1 | 0 | 1 | U | f$_3$ → f$_4$ |
| 4 | 1 | 1 | 1 | 1 | — | f$_4$ UNCHANGED |
| 5 | 1 | 0 | * | * | — | UNCHANGED |
| 6 | 0 | 0 | 0 | 0 | — | f$_1$ UNCHANGED |
| 7 | 0 | 0 | 1 | 0 | D | f$_2$ → f$_1$ |
| 8 | 0 | 0 | 0 | 1 | D | f$_3$ → f$_2$ |
| 9 | 0 | 0 | 1 | 1 | D | f$_4$ → f$_3$ |

FIG. 5

| FREQUENCY CLOCK | CONTROL SIGNAL FREQUENCY AT 12.5% | CONTROL SIGNAL FREQUENCY AT 50% | CLOCK CHANGING POINT | CORRESPONDING FAST OPERATION SPEED TIMES (a) |
|---|---|---|---|---|
| $f_1 = 450$ KHz | (14 KHz) | 3.5 KHz | CHANGE TO $f_2$ BELOW 117 TIMES | $117 \leq a \leq 300$ (2% DETECTION ACCURACY) |
| $f_2 = \frac{450}{4}$ KHz | 3.5 KHz | 879 Hz | CHANGE TO $f_1$ AT 117 TIMES<br>CHANGE TO $f_3$ BELOW 29 TIMES | $29 \leq a < 117$ |
| $f_3 = \frac{450}{16}$ KHz | 879 Hz | 220 Hz | CHANGE TO $f_2$ AT 29 TIMES<br>CHANGE TO $f_4$ BELOW 7 TIMES | $7 \leq a < 29$ |
| $f_4 = \frac{450}{64}$ KHz | 220 Hz | (55 Hz) | CHANGE TO $f_3$ AT 7 TIMES | $0.9 \leq a < 7$ (COUNTER: OVER-FLOW) |

PULSE DUTY RATIO DESCRIMINATION CIRCUIT

FIELD OF THE INVENTION

The present invention relates generally to a pulse duty ratio discrimination circuit and, more particularly, to a duty discrimination circuit for discriminating duty ratios of the control signals to be recorded on a magnetic tape of, for example, a video tape recorder (VTR).

BACKGROUND OF THE INVENTION

Conventionally a VHS system format for a home VTR has been adapted to a control coding system for recording a VHS index search system signal (VISS signal) and a VHS address search system signal (VASS signal) on the tape by changing the duty of control signals to be recorded on a magnetic tape (hereinafter simply referred to as a tape). This system uses two kinds of duty ratios, the 60 ($\pm$5) % duty ratio and the 27.5 ($\pm$2.5) % duty ratio for the control signals to be recorded, and modulates the control signals according to a predetermined format. Accordingly a reproducer side discriminates between the VISS signal and the VASS signal by discriminating the duty ratios of the control signals.

So, as a way of discriminating the duty ratios of the reproduced control signals, the time that the control signal stays in a high level state is counted based on a predetermined clock and is then compared with a threshold value. Provided that the threshold value is a predetermined constant value, the discriminating operation can not cope with a frequency change of the reproduced control signal. Accordingly, a way of changing the threshold value in response to the frequency of the reproduced control signal has been employed.

FIG. 1 is a block diagram showing an example of conventional pulse duty ratio discrimination circuits for discriminating the duty ratios of the control signals. FIG. 2 is a time chart for explaining the operation of the pulse duty ratio discrimination circuit. 1 denotes a sequencer which generates a counter latch signal 200, a counter reset signal 300 and a sampling pulse 400, based on a reproduced control signal 100 and a reference clock 50. 2 denotes a counter for up-counting the reference clock 50. The counter 2 is reset by the reset signal 300. 3 denotes a latch for latching the count value of the counter 2 at the input timing of the latch signal 200. 4 denotes a divider for dividing in half the (n+1) bit output of the counter 2 and for outputting the divided value as an output A. 5 denotes a magnitude comparator for comparing the magnitude of the output B of the latch 3 with the magnitude of the output A of the divider 4 and for outputting a high level signal into a D-type flip-flop 6 when A>B. 6 denotes the D-type flip-flop for outputting the comparing result of the magnitude comparator 5 as a pulse duty ratio discriminating signal when the comparing result of the magnitude comparator 5 is applied to its data terminal D, and the sampling pulse 400 is applied to its clock terminal CK.

The sequencer 1 generates the counter latch signal 200, the counter reset signal 300 and the sampling pulse 400 from the reproduced control signal 100, as shown in FIG. 2(B). After the counter 2 is reset to 0 at the leading edge of the counter reset signal 300 output from the sequencer 1, as shown in FIG. 2(C), the counter 2 starts to count the reference clock. The count value thus increases, as shown in FIG. 2(A). After that, the counter latch signal 200 is output from the sequencer 1, as shown in FIG. 2(D), the latch 3 latches the count value of the counter 2 at that point, and sends the latched value to the magnitude comparator 5 as an output B (see FIG. 2(F)).

Additionally, the divider 4 successively divides in half the count value of the counter 2 and sends the divided value to the magnitude comparator 5. If the output of the divider 4 is smaller than the output of the latch 3 at the time that the signal 200 has been output, the output of the magnitude comparator 5 becomes a low level at that timing. If the output of the divider 4 becomes larger than the output of the latch 3 before the counter reset pulse 300 is generated in the increase of the count value of the counter 2, the output of the magnitude comparator 5 becomes a high level. If the output of divider 4 remains smaller than the output of the latch 3, the output of the magnitude comparator 5 remains in the low level. The comparing result of the magnitude comparator 5 is transferred to the D-type flip-flop 6 at the output timing of the sampling pulse 400. Therefore, when the duty ratio of the control signal is more than 50%, the Q output of the D-type flip-flop 6 becomes the low level (logic value "0"). When the duty ratio of the control signal is below 50%, the Q output of the D-type flip-flop 6 becomes the high level (logic value "1") and the pulse duty ratio discriminating signal 500 is output, as shown in FIG. 2(H).

Recently, VTRs have exhibited an inclination toward increasing the speeds of fast forwarding/fast rewinding operations for the purpose of improving their operability, so the frequency range of the reproduced control signal 100 is steadily expanding. Accordingly, to cope with this recent inclination the pulse duty ratio discrimination circuit must increase the speed of the reference clock 50 in order to keep the accuracy of the detection in a higher order, which correspondingly increases the bit scale of the counter 2. For instance, if 2% has been set as the accuracy of the detection so as to cope with the high speed of 300 times fast forwarding and/or fast rewinding operation, the frequency of the control signal is given by 30 Hz$\times$300 times=9 KHz. Accordingly, in this case the frequency of the reference clock 50 is given by 9 KHz/0.02=450 KHz. To cope with a normal operation control signal 100 with frequency of 30 Hz, the required bit scale of counter 2 is given by 450 KHz/30 Hz=15,000, i.e., 14 bit (=16384). This requirement increases the circuit scale of the pulse duty ratio discriminating circuit, thereby increasing its cost.

As described above, the conventional pulse duty ratio discrimination circuit, which discriminates the duty ratios of the reproduced control signals by initially counting the time that the control signal stays in a high level state based on a predetermined clock and by then comparing the count value with a threshold value, must use a high speed clock because of the inclination toward expanding the frequency range of control signals. Accordingly, the conventional. pulse duty ratio discrimination circuit has a drawback that necessitates using a large bit scale counter which causes the circuit scale to be enlarged, thereby increasing the cost of the circuit.

SUMMARY OF THE INVENTION

It is, therefore, an object of the present invention to provide a pulse duty ratio discrimination circuit which is able to remove the drawbacks in the prior art.

Another object of the present invention is to provide an inexpensive pulse duty ratio discrimination circuit which is able to avoid an increase in the circuit scale by obviating the need for increasing the bit scale of the counter for counting clocks.

In order to achieve the above object, a pulse duty ratio discrimination circuit, according to one aspect of the present invention, discriminates duty ratios of input signals by comparing a count value with a threshold value. This comparison is achieved by using a counter with clocks to count a time period starting with a reference level changing point occurring every predetermined period in the input signal and ending with a level returning point. The discrimination circuit is provided with period determination means for determining the periods of the input signals by resetting the count value of the counter at the period of the input signal and by comparing actual count values for a plural number of count patterns of the counter established in advance. The discrimination circuit also employs a clock selection means for selecting the frequency of the clock based on the determination result of the period determination means.

In the pulse duty ratio discrimination circuit according to the present invention, the period determination means determines the period of the input signal. The clock selection means selects the frequency of the clocks by the determination result of the period determination means.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS INVENTION

A more complete appreciation of the present invention and many of its attendant advantages will be readily obtained as the invention becomes better understood by reference to the following detailed description when considered in connection with the accompanying drawings, wherein:

FIG. 4 is a logic table illustrating the operation of the pulse duty ratio discrimination circuit shown in FIG. 3; and FIG. 5 is a diagram showing the relation of the changing points of the reference clocks with a number of fast operation speeds corresponding to clock changing points in the pulse duty ratio discrimination circuit, as shown in FIG. 3.

DESCRIPTION OF THE PREFERRED EMBODIMENTS

Figure 1:
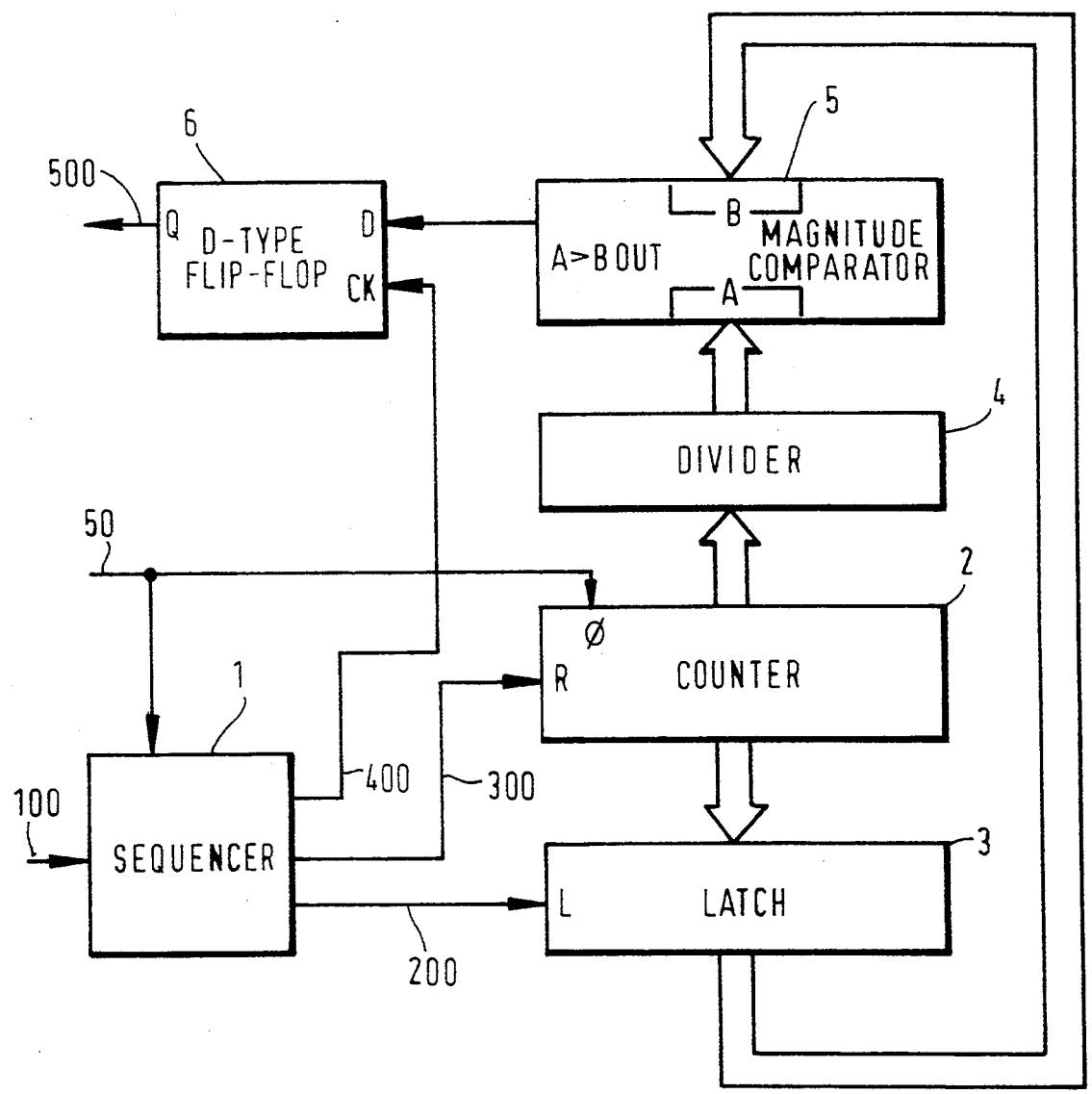
FIG. 1 is a block diagram showing a conventional pulse duty ratio discrimination circuit.
Figure 2:
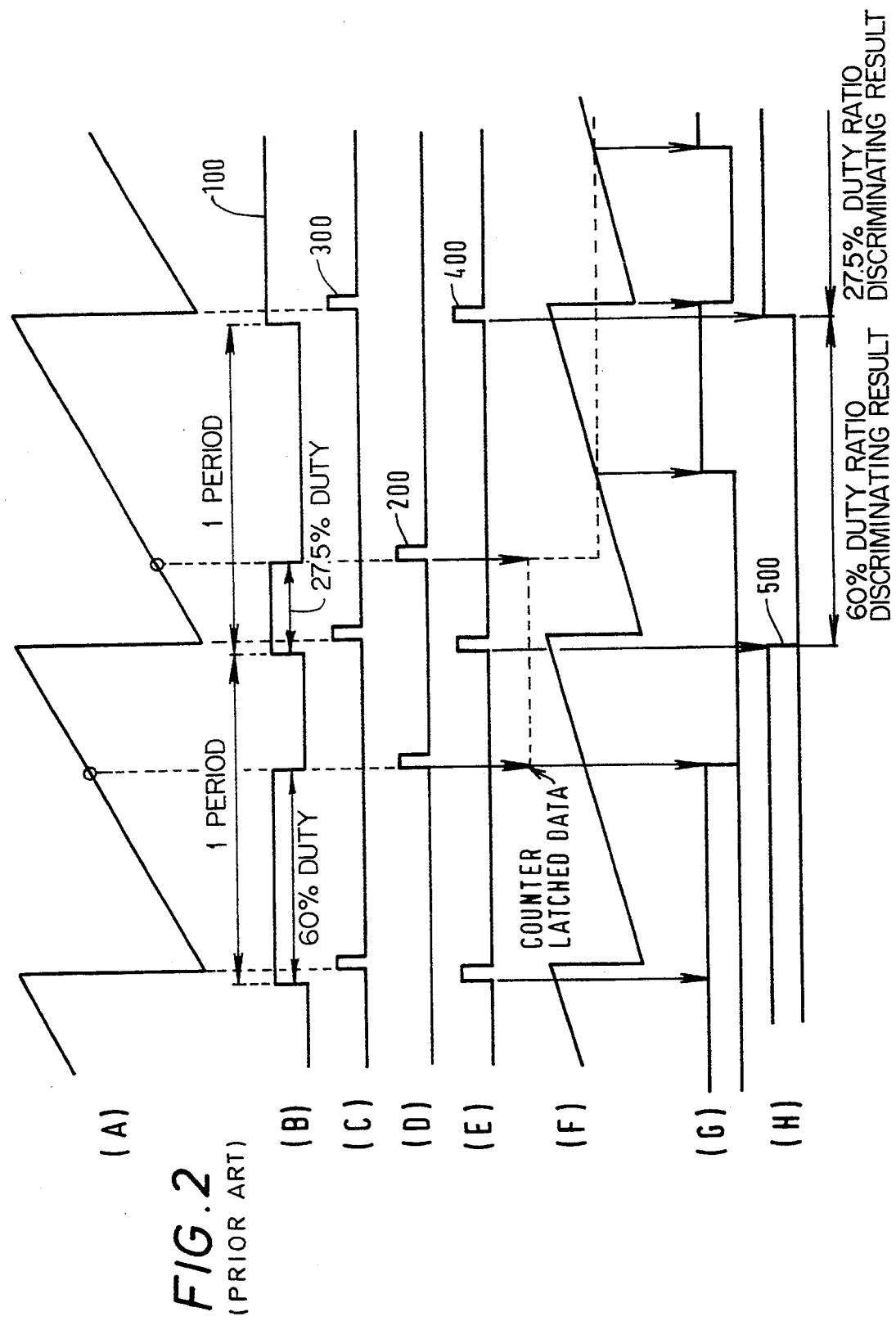
FIG. 2 is a time chart illustrating the operation of the conventional pulse duty ratio discrimination circuit, as shown in FIG. 1.

The present invention will be described in detail with reference to FIGS. 3, 4 and 5. Throughout the drawings, reference numerals or letters used in FIGS. 1 and 2 will be used to designate like or equivalent elements for simplicity of explanation.

Figure 3:
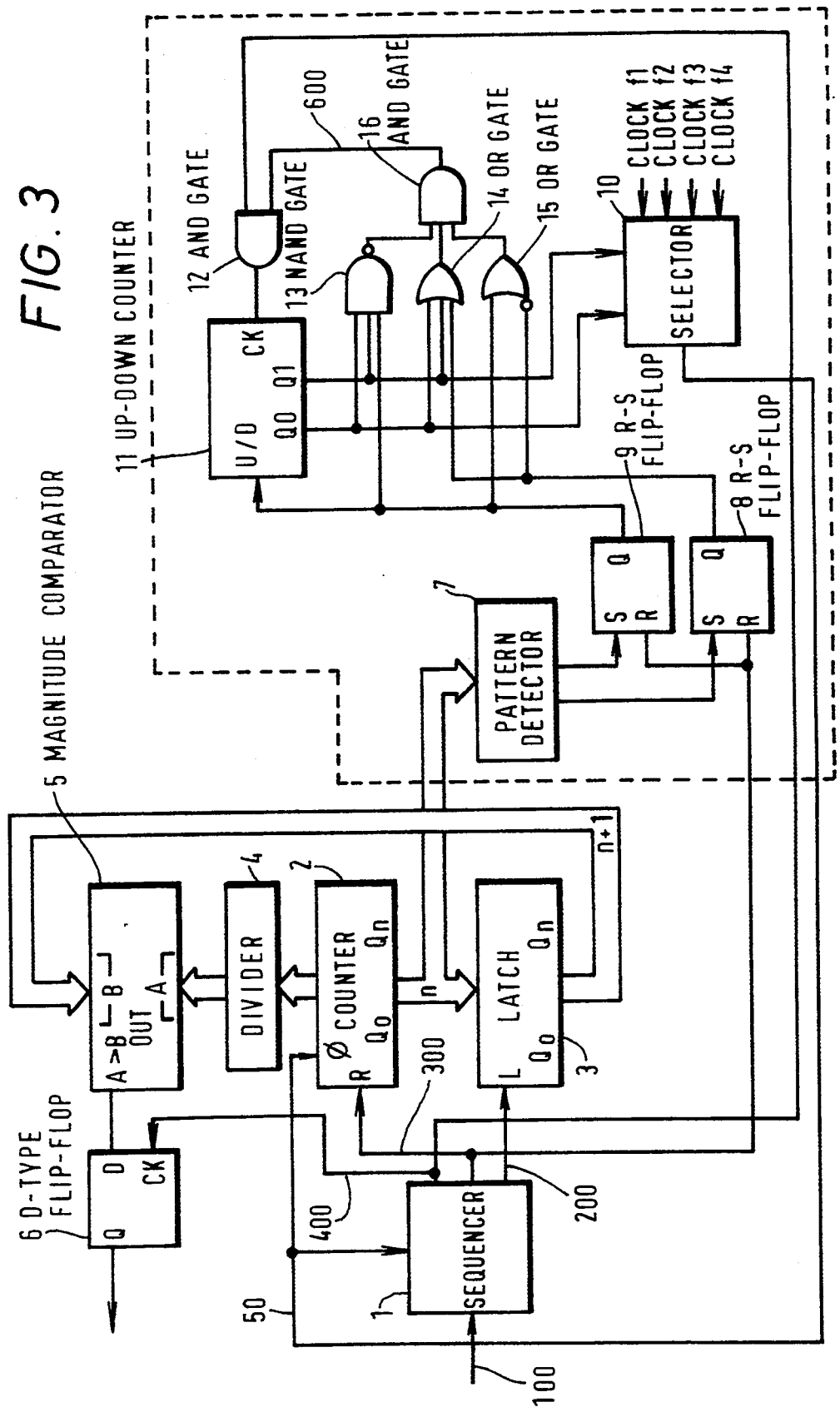
FIG. 3 is a block diagram showing one embodiment of the pulse duty ratio discrimination circuit according to the present invention.

Referring now to FIG. 3, a first embodiment of the pulse duty ratio discrimination circuit according to the present invention will be described in detail. FIG. 3 is a block diagram showing this embodiment of the pulse duty ratio discrimination circuit. 1 denotes a sequencer for generating a counter latch signal 200, a counter reset signal 300 and a sampling pulse 400, based on a reproduced control signal 100 and a reference clock 50. 2 denotes a counter for up-counting the reference clock 50. The counter 2 is reset by the reset signal 300. 3 denotes a latch for latching the count value of the counter 2 at the input timing of the latch signal 200. 4 denotes a divider for dividing in half the (n+1) bit output of the counter 2 and for outputting the divided value as an output A. 5 denotes a magnitude comparator for comparing the magnitudes of the output B of the latch 3 with the output A of the divider 4 and for outputting a high level signal into to a D-type flip-flop 6 when A>B. 6 denotes the D-type flip-flop for outputting the comparing result of the magnitude comparator 5 as a duty ratio discriminating signal, when the comparing result of the magnitude comparator 5 is applied to its data terminal D and when the sampling pulse 400 is applied to its clock terminal CK. 7 denotes a pattern detection circuit for detecting the point of 12.5% of the full count value of the counter 2 as a pattern 0 and also the point of 50% of the full count value of the counter 2 as a pattern 1. 8 and 9 denote R-S flip-flops, respectively, which are set by the detected pattern obtained by the pattern detector circuit 7 and which are reset by the counter reset signal 300. 10 denotes a selector for selecting any one of the clock frequencies f1, f2, f3 and f4 which are different from each other according to output signals of an up-down counter 11. The selected clock is then used as a reference clock 50 for the sequencer 1 and the counter 2. The selector 10 selects the highest clock frequency f1 when both the outputs of the up-down counter 11 are 0, while the selector 10 selects the lowest clock frequency f4 when both outputs of the up-down counter 11 are 1. Here the clock frequencies f1, f2, f3 and f4 are related by f1>f2>f3>f4. 11 denotes the 2 bit up-down counter counting up and down the sampling pulse 400 by the output signal of the R-S flip-flop 9. 12 denotes an AND gate which gates on or off the sampling signal 400 to the up-down counter 11 according to the presence or absence of a clock gate signal 600. 13 denotes a NAND gate. 14 and 15 denote OR gates, respectively. 16 denotes an AND gate. Gates 13 through 16 jointly generate the clock gate signal 600 based on the output signals Q0, Q1 of the up-down counter 11 and the output signal of the R-S flip-flops 8 and 9.

Now the operation of the embodiment as described above will be explained.

Counter 2, latch 3, divider 4 and magnitude comparator 5 perform operations in the same manner as described above in discussion of the prior art example. However, in the preferred embodiment of the present invention, the pattern detection circuit 7 detects the pattern 0 or pattern 1 according to the count value of the counter 2, and then outputs the detected result to the set input terminals S of the R-S flip flops 8 and 9. As a result, the R-S flip-flop 8 will be set to "1" when the period of reproduced control signal 100 is more than 12.5% of the counter period of the counter 2. Similarly, the R-S flip-flop 9 will be set to "1" when the period of the reproduced control signal 100 is more than 50% of the counter 2. These states are listed in the second and the third columns in the table as shown in FIG. 4. Here, the up-down counter 11 with a 2 bit scale performs its up-count operation at states 1, 2 and 3 as listed in the first column in the table in FIG. 4. On the contrary, the up-down counter 11 operates its down-count at states 7, 8 and 9 as listed in the first column. Further, at states 4, 5 and 6, the clock gate signal 600 in FIG. 3 will be the low level so that the sampling pulse 400 will not be supplied as a clock to the up-down counter 11.

An operation of generating the clock gate signal 600 will now be explained. When both the outputs of the NAND gate 13 and the OR gate 14 are "1", the output of the OR gate 15 will be "1" in one of the states that pattern 0 is "0" or pattern 1 is "1" and this output will be the clock gate signal 600 through the AND gate 16. When this clock gate signal 600 is "1" the AND gate 12 will open and the sampling pulse 400 will be supplied as a clock to the up-down counter 11. But when both of the outputs Q0, Q1 of the up-down counter 11 are "1" and pattern 1 is "1" the output of the AND gate 12 will be "0" and the NAND gate 13 will be closed by closing the AND gate 16 to inhibit the pass of the clock gate signal 600. So, the sampling pulse 400 is no longer supplied to the up-down counter 11, thereby inhibiting further operation of this counter. Therefore, though the lowest clock frequency f4 is selected, further operation of the up-down counter 11 can be inhibited. In the same way, the OR gate 14 inhibits further operation of the up-down counter 11 though both the outputs Q0, Q1 of the up-down counter 11 are "0" and the highest clock frequency f1 is selected.

Here, the logic table of the duty discrimination circuit, as shown by FIG. 4, lists the discriminating states of the pattern detection circuit 7, i.e., the states of the outputs Q0, Q1 of the up-down counter 11 corresponding to the states 1 through 9 and the various values of the clock frequencies selected by the selector 10 for each state. For instance, in state 1 the pattern detection circuit 7 detects the "1" as the pattern 0 and also detects the "1" as the pattern 1. Accordingly the up-down counter 11 up-counts the sampling pulse signal 400, so as to change the outputs Q0, Q1, from "0", "0" to "1", "0". When the outputs Q0, Q1 of the up-down counter 11 are "0", "0", the clock frequency f1 has been selected as the reference clock 50 by the selector 10. Clock frequency f2 is selected as the reference clock 50 to be supplied to the sequencer 1 and the counter 2 when outputs Q0 and Q1 change state from "0", "0" to "1", "0". Also during this time, the clock gate signal 600 has been "1" so that the sampling clock signal 400 has been supplied to the up-down counter 11 through the AND gate 12. As indicated by this example involving state 1, the operation of evaluating the period of the reproduced control signal 100 in terms of the presently selected reference clock 50 as determined by the two output signals, i.e., the pattern 0 and the pattern 1, and also the operation of selector 10 in choosing a reference signal with a frequency suitable to the period of the reproduced control signal are carried out as shown in FIG. 4.

Additionally, although the values of not only the patterns 0 and 1 but also the clock frequencies f1 through f4 must be set properly in correspondence with the frequency range of the input signal, they are not always limited to specific values. By way of example, the case of a high speed of 300 times fast forwarding and/or fast rewinding operation will be described. First, the clock frequency f1 is set to 450 KHz as in the prior art example given above. Also clock frequencies f2, f3 and f4 are related to each other by the relation $f(n+1) = fn/4$, where, $n = 1, 2, 3$. Therefore, to cope with a normal operation control signal 100 with frequency of 30 Hz the required bit scale of counter 2 is given by $f4/30 Hz = 450 KHz/64 \times 30 Hz = 234$. That is, the bit scale of counter 2 in the preferred embodiment may be set to 8 bit, as contrasted with the 14 bit scale required in the prior art example above. FIG. 5 illustrates a table listing a number of fast operation speeds corresponding to clock changing points (i.e., points at which the period of control signal 100 is more than 12.5% or more than 50%, respectively, of the counter period of counter 2) under the conditions of this example. As it will be easily seen from the table in FIG. 5, the ranges of the fast operation speeds at the clock changing points overlap each other for the respective clock frequencies f1 and f2. This range overlap shows that the clock changings operate correctly.

According to the above embodiment, by selectively supplying the reference clock 50 changed among the four steps of clock frequencies f1, f2, f3 and f4, the bit scale needed for counter 2 can be restricted to 8 bit so as to cope with 300 times fast forwarding operation/fast rewinding operation. Therefore, the above embodiment maintains a small circuit scale while simultaneously coping with the inclination toward increasing the speeds of fast forwarding/fast rewinding operations by expanding the frequency range of the reproduced control signal 100.

As described above, the present invention can provide an extremely preferable pulse duty ratio discrimination circuit. That is, the pulse duty ratio discrimination circuit according to the present invention can make the circuit inexpensive by maintaining a small circuit scale by obviating the need to increase the bit scale of the counter for counting clocks, even if the high speed clock frequency is used for coping with the inclination toward expanding the frequency range of reproducer control signals.

Although only the preferred embodiments of the present invention have just been described and illustrated, those skilled in the art will understand that various changes, modifications, and substitutions of equivalent elements may be made in the preferred embodiments without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A pulse duty ratio discrimination circuit for discriminating duties of input signals comprising:
   means for counting a time interval of the input signal from a reference level changing point occurring every predetermined period of the input signal to a level returning point by using a clock;
   means for comparing a count value obtained by the counting means with a prescribed threshold value;
   means for determining a period of the input signals; and clock selection means responsive to the period determining means for selecting a specific clock having a frequency suitable to the comparing means.

2. A pulse duty ratio discrimination circuit as claimed in claim 1, wherein the period determining means includes:

means for resetting the count value obtained by the counting means at the period of the input signal, and second comparing means responding to the resetting means for comparing actual count values corresponding to a prescribed number of count patterns preset in the counting means.

3. A pulse duty ratio discrimination circuit as claimed in claim 2, wherein the resetting means includes:

pattern generator means for selectively generating a set of pattern signals corresponding to the count value of the counting means, up/down counter means for controlling the clock selection means, and gate means for selectively activating the up/down counter means by logically responding to the pattern signals generated from the pattern generator means.

4. A circuit for determining a pulse duty ratio factor of an input pulse signal, the circuit comprising:

a clock pulse generator;

a counter for counting clock pulses generated during a pulse width of the input pulse signal;

a comparator for comparing the number of counted pulses with a threshold value equivalent to a predetermined fraction of the number of counter pulses generated during one input pulse period, and generating a determination output on the basis of said comparison;

means for determining the input pulse period; and means for adjusting the clock pulse frequency in response to the period thus determined.

5. A circuit as claimed in claim 4, further comprising means for deriving from the number of counted pulses an indication as to whether the input pulse period lies within a given range, appropriate to the clock pulse frequency, and adjusting said frequency if the period lies outside said range.

6. A pulse duty ratio discrimination circuit for discriminating duties of input signals by comparing a count value with a threshold value by counting a time period from a reference level changing point occurring every predetermined period in the input signal to a level returning point with a counter by 6 using clocks, the pulse duty ratio discrimination circuit comprising:

period determination means for determining the periods of the input signals by resetting the count value of the counter at the period of the input signal, and comparing actual count values for a plural number of count patterns of the counter established in advance; and clock selection means for selecting the frequency of the clock based on a determination result of the period determination means.

* * * * *